US008884669B2

(12) United States Patent
Geng et al.

(10) Patent No.: US 8,884,669 B2
(45) Date of Patent: Nov. 11, 2014

(54) ELECTRONIC DEVICE WITH POWER MODE CONTROL BUFFERS

(71) Applicants: Xiaoxiang Geng, Suzhou (CN); Zhihong Cheng, Suzhou (CN); Huabin Du, Suzhou (CN); Miaolin Tan, Suzhou (CN)

(72) Inventors: Xiaoxiang Geng, Suzhou (CN); Zhihong Cheng, Suzhou (CN); Huabin Du, Suzhou (CN); Miaolin Tan, Suzhou (CN)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/964,110

(22) Filed: Aug. 12, 2013

(65) Prior Publication Data

US 2014/0210523 A1    Jul. 31, 2014

(30) Foreign Application Priority Data

Jan. 25, 2013  (CN) .......................... 2013 1 0118959

(51) Int. Cl.
*H03L 7/00* (2006.01)
*H03K 19/00* (2006.01)

(52) U.S. Cl.
CPC .................................. *H03K 19/0016* (2013.01)
USPC ........................... 327/143; 327/142; 327/198

(58) Field of Classification Search
CPC ..... G06F 1/3287; G06F 1/3234; H03K 3/0375; H03K 17/223; H03K 19/0016
USPC ......................................... 327/142, 143, 534
See application file for complete search history.

(56) References Cited

U.S. PATENT DOCUMENTS

| | | | |
|---|---|---|---|
| 6,765,433 B1 | 7/2004 | Kao | |
| 7,164,301 B2 | 1/2007 | Chun | |
| 7,683,697 B2 * | 3/2010 | Berzins et al. | 327/534 |
| 2009/0037785 A1 * | 2/2009 | Whetsel | 714/727 |
| 2009/0295463 A1 * | 12/2009 | Katou | 327/534 |

\* cited by examiner

*Primary Examiner* — John Poos
(74) *Attorney, Agent, or Firm* — Charles Bergere

(57) ABSTRACT

An electronic device has a power control module for causing selected functional blocks to run in a low power mode of operation, while leaving other functional blocks supplied continuously with power. A power mode control distribution network includes serially connected chains of buffers in a distribution tree for distributing power mode control signals received at a common input end to respective output ends which are connected to respective functional blocks. In the low power mode of operation the power control module causes power to be supplied continuously to output buffers at the output ends of the chains while causing power supplied to other buffers to be reduced or cut-off. The output buffers include feedback paths for causing the states of the output buffers prior to the low power mode of operation to latch during the low power mode of operation.

16 Claims, 8 Drawing Sheets

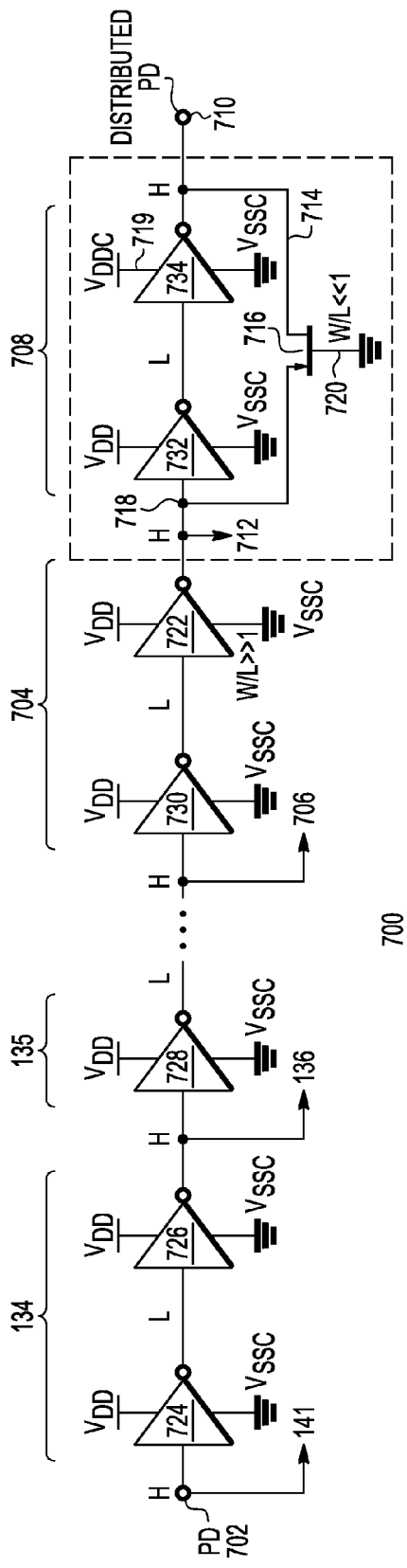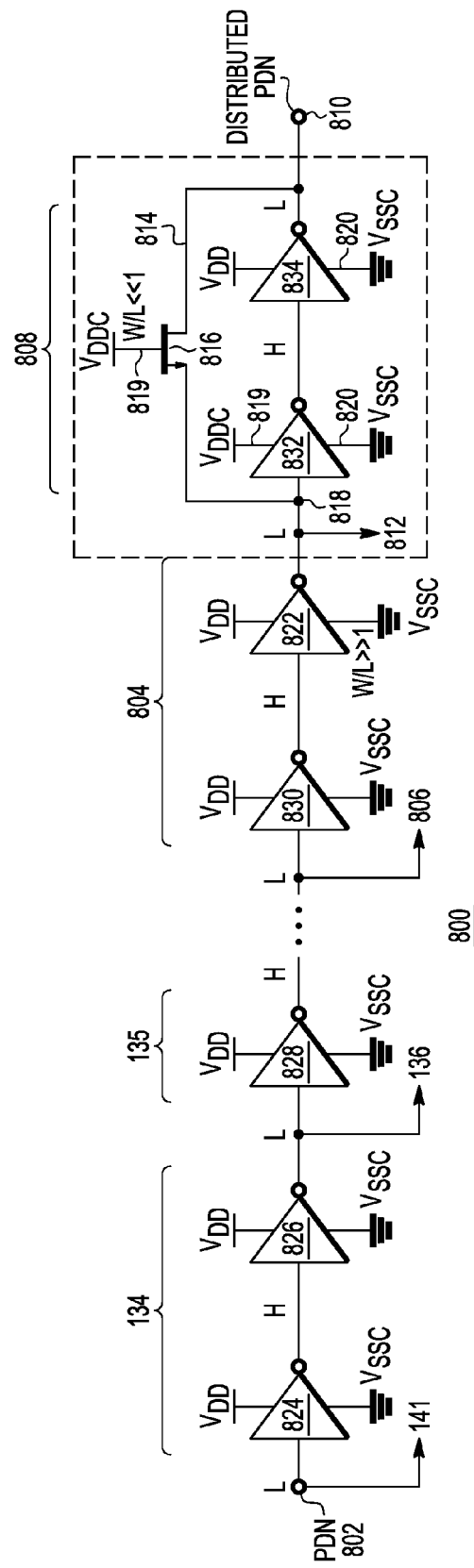
FIG. 7
FIG. 8

US 8,884,669 B2

ELECTRONIC DEVICE WITH POWER MODE CONTROL BUFFERS

BACKGROUND OF THE INVENTION

The present invention is directed to electronic devices that can operate in a low power mode to reduce power consumption and, more particularly, to circuitry for buffering power mode control signals.

Integrated circuit (IC) devices, such as data processing systems, often include power control modules that cause selected functional blocks to operate in a low power mode with power supply reduced or cut-off and subsequently to be restored to a full power mode, while leaving other functional blocks supplied continuously with power. A power control module typically includes one or more power gates, which can switch off connection of part or all of the selected blocks to a supply voltage (header gate) or to ground (footer gate). The power gates may be in the power distribution network or in the functional blocks.

The functional blocks whose power is controlled may receive power mode control signals. These power controlled functional blocks may include state-sensitive elements such as state retention cells for saving the data in the blocks before they enter low power mode, and isolation cells for preventing short circuits appearing between the block in low power mode and blocks that are still powered and running. A power mode control signal may be provided by system software and/or hardware and may be generated by a power management controller. The power mode control signal is then distributed to multiple functional blocks by a power mode control distribution network, which typically has serially connected chains of buffers controlling respective blocks. Typically, the serially connected chains of buffers form part of a branching tree, each branch starting from a common input end and distributing the power mode control signals to an output end that is connected to a respective functional block.

It is necessary for the power mode control distribution network to maintain the validity of the distributed power mode control signals whether or not the blocks they control are in low power mode. If the power mode control distribution network is always supplied with power, the leakage current of the network is a significant factor in the standby or sleep current of the IC, which it is desirable to reduce.

BRIEF DESCRIPTION OF THE DRAWINGS

The present invention is illustrated by way of example and is not limited by embodiments thereof shown in the accompanying figures, in which like references indicate similar elements. Elements in the figures are illustrated for simplicity and clarity and have not necessarily been drawn to scale.

FIG. 7 is a schematic circuit diagram of part of a power mode control distribution network in accordance with another embodiment of the invention in an electronic device of the kind shown in FIG. 1, given by way of example, FIG. 8 is a schematic circuit diagram of part of a power mode control distribution network in accordance with another embodiment of the invention in an electronic device of the kind shown in FIG. 1, given by way of example.

DETAILED DESCRIPTION OF THE INVENTION

U.S. Pat. No. 7,683,697 issued Mar. 23, 2010, which is assigned to the assignee of the present application, and the disclosure of which is incorporated herein by reference, discloses a method of buffering a power mode control signal that reduces leakage current of the power mode control network.

Figure 1:
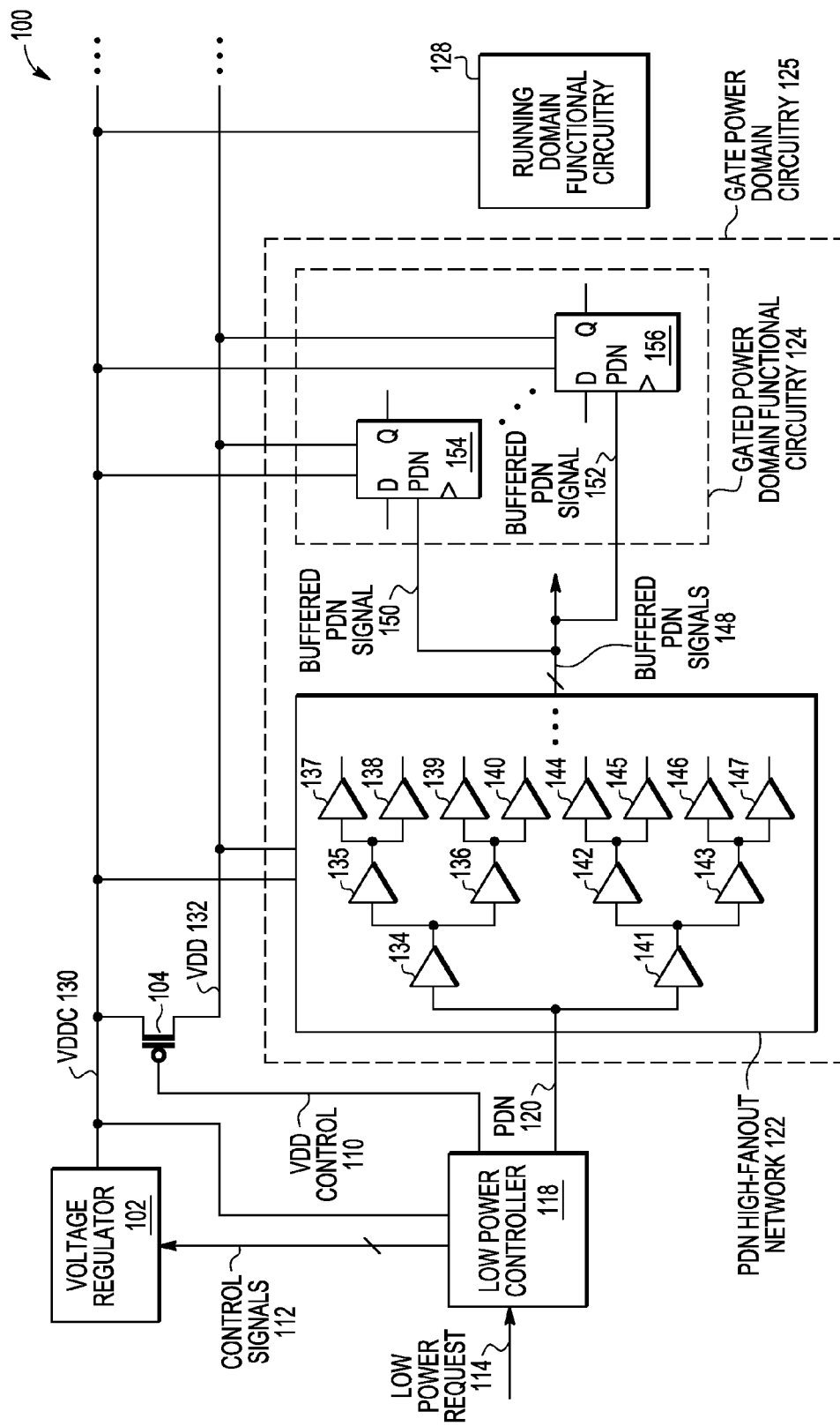
FIG. 1 is a block schematic diagram of an electronic device in accordance with one embodiment of the invention, given by way of example.

FIG. 1 illustrates an electronic device comprising a data processing system 100 in accordance with one embodiment of the present invention. The system 100 includes a voltage regulator 102, a power supply switch 104, a low power controller 118, gated power domain circuitry 126, and running domain functional circuitry 128. The gated power domain circuitry 126 includes a power down (PDN) fanout network 122 and gated power domain functional circuitry 124, where PDN refers to a power mode control power down active low signal. Alternatively, the power down (PD) fanout network 122 may distribute a PD isolation control power down active high signal. The gated power domain functional circuitry 124 includes any number of elements which may be powered down. For example, in the illustrated embodiment, gated power domain functional circuitry 124 includes a plurality of storage elements, such as flip flops 154 and 156. Each of flip flops 154 and 156 is capable of retaining state when their power supply VDD is powered down. This is controlled via a PDN input. In one embodiment, the flip flops 154 and 156 form part of state retention registers.

The PDN fanout network 122 includes a plurality of buffers 134 to 147 coupled in a fanout or branching tree configuration and providing a plurality of distributed buffered PDN signals 148. Each of the distributed buffered PDN signals 148 may be provided to a circuit element in gated power domain function circuitry 124 that can be powered down. For example, a first distributed buffered PDN signal 150 of distributed buffered PDN signals 148 may be provided to the PDN input of flip flop 154 and a second distributed buffered PDN signal 152 of distributed buffered PDN signals 148 may be provided to the PDN input of flip flop 156. In the illustrated embodiment, each buffer output is coupled to the inputs of two buffers but it will be appreciated that each buffer output may be coupled to the inputs of more than two subsequent buffers.

The voltage regulator 102 provides continuous voltage power supply (VDDC) on a VDDC line 130. Gated power supply voltage VDD is also supplied on a VDD line 132 through a power supply switch 104, which can be controlled to cut-off power from gated elements whose power is supplied from the VDD line 132. In the illustrated embodiment power supply switch 104 is implemented by a P-channel transistor; however, alternative embodiments may use different switching mechanisms to perform the functionality of power supply switch 104. Referring to FIG. 1, a current conduction path of the transistor 104 is coupled between the VDDC line 130 and the VDD line 132, and a control electrode of transistor 104 is coupled to receive a power switch control signal (VDD control 110) from the low power controller 118. Continuous power is provided over the VDDC line 130 to the low power controller 118, the gated power domain circuitry 126, and the running domain functional circuitry 128. Gated power is provided over the VDD line 132 to the gated power domain circuitry 126.

The low power controller 118 receives a low power request signal 114 and provides a power mode control PDN signal 120 to gated power domain circuitry 126. The low power controller 118 also provides regulator control signals 112 to the voltage regulator 102. In the illustrated embodiment of system 100, VDD control 110 and low power request 114 are active high signals and PDN 120 is an active low signal. A logic high of the VDD control 110 turns off the switch 104. The power mode control PDN signal 120 is buffered and distributed through the fanout network 122 and provided to state retention registers, such as flip flops 154 and 156. However, the fanout network 122 may alternatively buffer and distribute other power mode control signals, to control isolation logic, or as an input to embedded memory control pins, instead of to control state retention registers, as illustrated in FIG. 1. In response to their corresponding power mode control PDN signal 120, these registers, isolation logic, or embedded memory prepare for operation in low power mode and resume operation in full power mode when the voltage on VDD line 132 is restored to close to VDDC.

Since the distributed power mode control signals 148 are used to indicate a low power mode, their values need to be valid for the duration of the low power mode period. For example, as illustrated in FIG. 1, the distributed buffered PDN signals 148 are provided to PDN inputs of flip flops 154 and 156 which control the configuration and operation of flip flops 154 and 156 during low power mode, and thus need to provide a valid logic value during low power mode. The gated power domain circuitry 126 includes circuitry whose clock signals may be removed during low power modes such as when system 100 is in a deep sleep mode or is in an idle (standby) mode. Removing power from these portions of the circuitry further reduces leakage current. During a low power mode, the VDD line 132 is decoupled from the VDDC line 130. In this state, only portions of the gated power domain circuitry 126 (those portions which, for example, retain state information) are powered from the VDDC line 130 while the remaining portions which are coupled to VDD 132 are powered down. The running domain functional circuitry 128 includes circuitry which is not placed in a deep sleep mode and therefore continuously receives power from the VDDC line 130. The running domain functional circuitry 128 may include, for example, a real time clock that needs to constantly remain powered, a deep sleep module which can periodically wake up the rest of the system 100 to check for activity, such as, for example, calls or messages, and/or an interrupt buffer which detects activity such as key presses.

Figure 2:
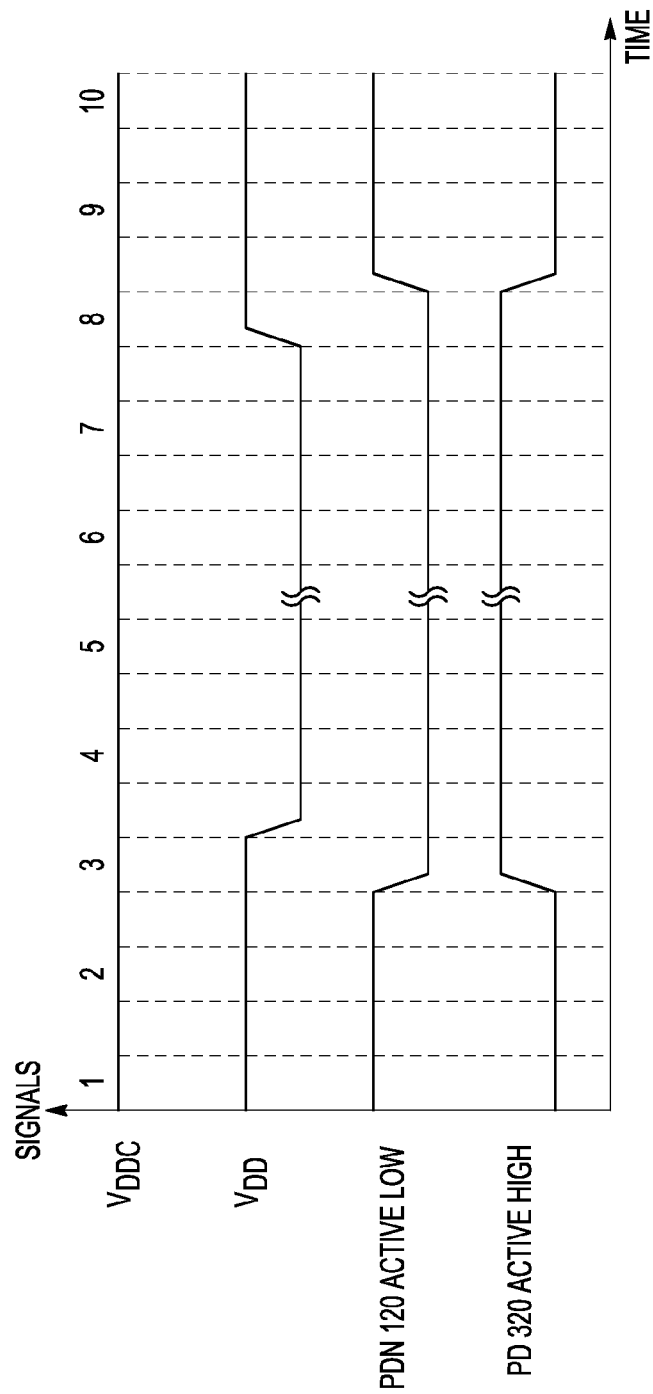
FIG. 2 is a waveform diagram of signals appearing in operation of the integrated circuit shown in FIG. 1.

The low power controller 118 may generate the power mode control PDN signal 120 in response to a low power request 114 from a power management module (not shown), software running on the data processing system 100 and that responds to a value stored in memory, or from a source external to data processing system 100. The implementations shown in FIGS. 1, 3, and 5 to 8 are header gate configurations, and VDD control 110 is an active high signal. while the implementations shown in FIGS. 4 and 9 to 12, are footer gate configurations. Each of the header or footer configurations may distribute an active low power mode control signal PDN 120 or a power mode control signal is an active high signal PD 320. FIG. 2 illustrates the relations between the different signals. Before the voltage VDD on the VDD line 132 is powered down, the active low signal PDN 120 switches from logic one to logic zero, and after the voltage on the VDD line 132 is restored to a value close to VDDC, the active low signal PDN 120 switches from logic zero to logic one. With the same timing, before the power supply to the gated functional blocks 124 is powered down, by floating the VDD line 132 as in FIGS. 1, 3 and 5 to 8 (or by floating the other (ground) gated power supply line 332 as in FIGS. 4 and 9 to 12) the active high signal signal PD 320 switches first from logic zero to logic one and after the gated power supply is restored to a value close to VDDC the active high signal PD 320 switches logic one to logic zero.

Figure 3:
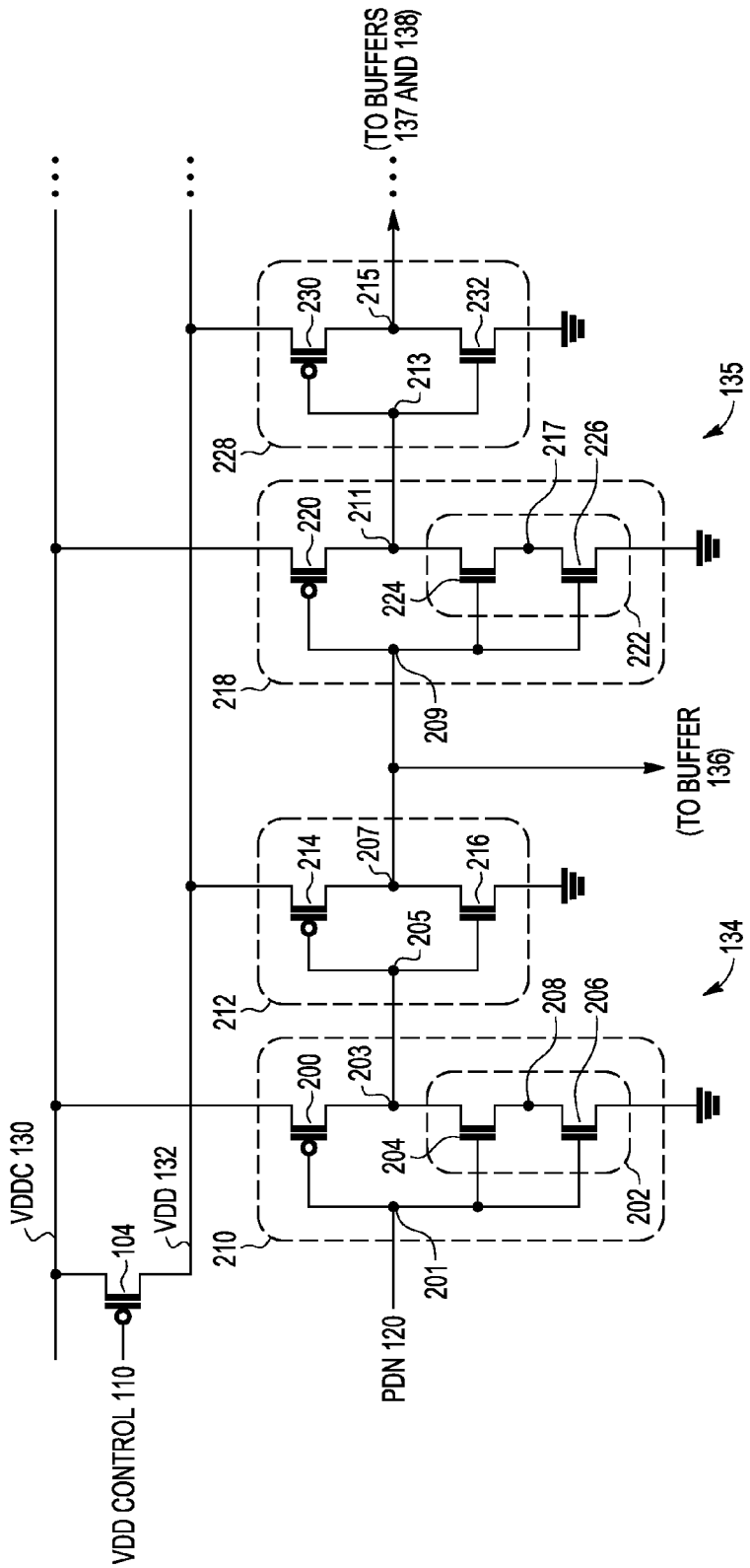
FIG. 3 is a schematic circuit diagram of part of a known power mode control distribution network in an electronic device of the kind shown in FIG. 1.
Figure 4:
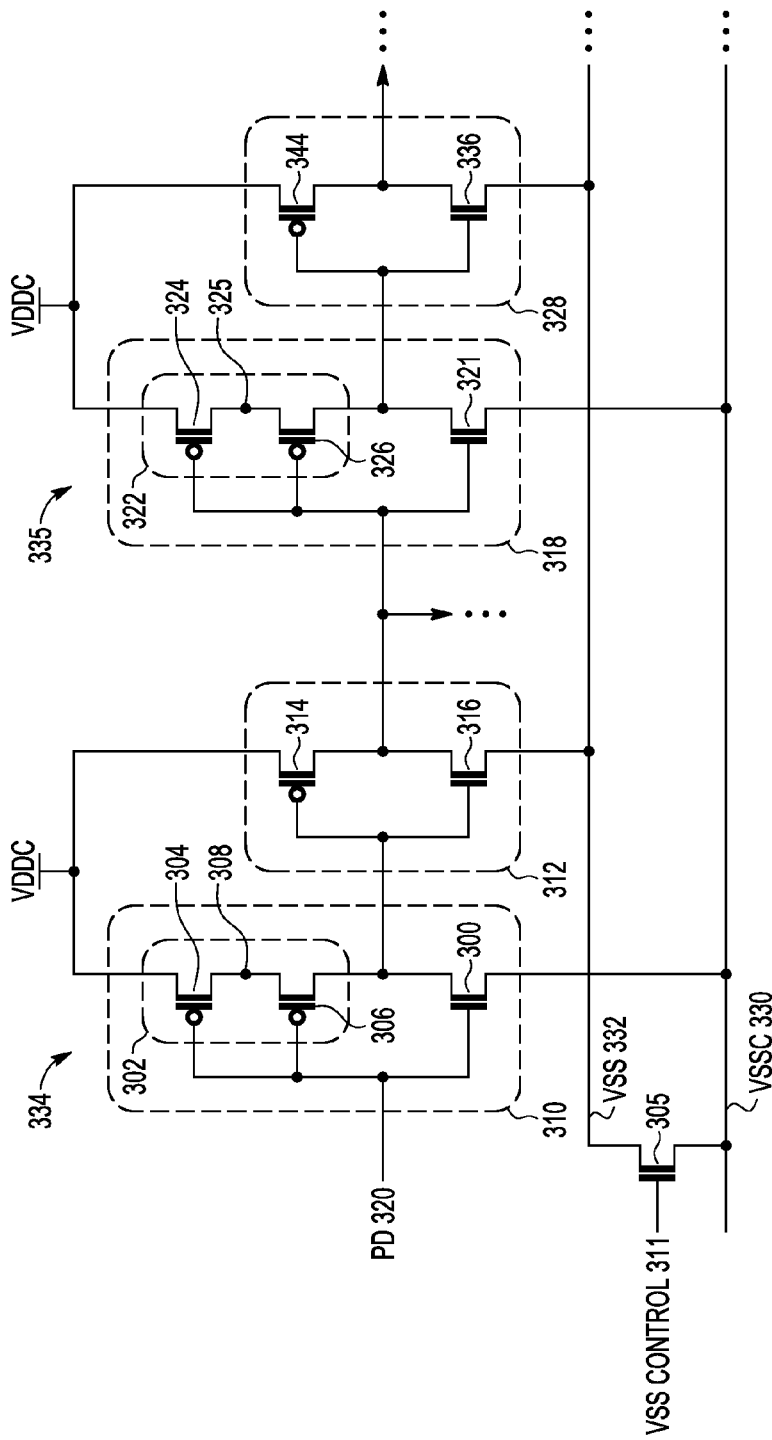
FIG. 4 is a schematic circuit diagram of part of another known power mode control distribution network in an electronic device of the kind shown in FIG. 1.

FIGS. 3 and 4 illustrate buffers 134 and 135 which are typical of the buffers in the PDN fanout network 122 as described in U.S. Pat. No. 7,683,697. In the configuration shown in FIG. 3, the buffer 134 includes an inverter 210 coupled to an inverter 212. The buffer 135 includes an inverter 218 coupled to an inverter 228. The inverters 210 and 218 are supplied with power from the continuous power VDDC line 130, whereas the inverters 212 and 228 are supplied with power from the gated power VDD line 132. The output node 207 of the buffer 134 fans out to a plurality of input nodes of other buffers, to the input of buffer 135 and to the input of buffer 136, as illustrated in FIG. 1. Each of the inverters 210 and 218 have stacked N-channel transistors 202 and 222 connected with current conduction paths in series with P-channel transistors 200 and 220 between the VDDC line 130 and ground and their gates connected to the input nodes 201 and 209 of the buffers 134 and 135, respectively. Each of the inverters 212 and 228 have N-channel transistors 216 and 232 connected with current conduction paths in series with P-channel transistors 214 and 230 between the VDD line 132 and ground and their gates connected to the output nodes 203 and 211 of the inverters 210 and 218, respectively.

In operation, during a full power mode, the PDN signal 120 is propagated through the fanout network 122 including the buffers 134 and 135 to the appropriate PDN inputs of elements within the gated power domain functional circuitry 124, which is fully powered in this mode. The voltage on the VDD line 132 is approximately equal to the voltage on the VDDC line 130. Therefore, the buffers 134 and 135 operate conventionally, fully powered.

However, during a low power mode, when the VDD line 132 is decoupled from the VDDC line 130, the voltage of the VDD line 132 is reduced to or near to ground. In this case, since the PDN signal 120 is active low, it is set to a logic level zero for low power mode. A logic level zero appears at node 201, a logic level one appears at the node 203, a logic level zero appears at the node 207, and the value of zero for PDN 120 is propagated through the buffer 134. The node 205 is at a logic level one, the transistor 216 is ON and draws current down from the node 207 to bring its value down to a logic level zero. In this situation it is the N-channel transistor 216 which assumes the primary role in pulling current from the node 207. Therefore, even though the current path of the P-channel transistor 214 is no longer receiving a voltage of approximately VDDC since the VDD line has been decoupled from the continuous voltage supply 102, the output of the buffer 134 is still able to provide a valid, non-inverted, value corresponding to the PDN signal 120. Thus, by removing power from alternate inverters such as 134 and 135 in the fanout network 122, the leakage current can be reduced, while still ensuring that the fanout network 122 adequately propagates a valid power mode control PDN signal 120 to the distributed signal 148 during the low power mode.

In the footer gate configuration shown in FIG. 4, which shows a portion of the fanout network 122 as described in U.S. Pat. No. 7,683,697 otherwise similar to the portion shown in FIG. 3, a buffer 334 includes an inverter 310 coupled to an inverter 312 and has an input receiving an active high control signal PD 320. A buffer 335 includes an inverter 318 coupled to an inverter 328. The inverters of the fanout network 122 are all supplied with voltage from the continuous voltage VDDC line 130. Alternate inverters, such as 310 and 318, are connected continuously to the other (ground) VSSC power supply line 330, and the intermediate inverters such as 312 and 328 are connected to a gated VSS (ground) power supply line 332. An N-channel transistor 305 is used as a power supply switch, receiving a power switch VSS control signal 311, which operates analogously to the VDD control signal 110, except that the VSS control signal 311 is an active low signal. The power mode control signal PD 320 and the VSS control signal 311 can be generated by a low power controller in a similar manner as PDN 120 and VDD control 110 are generated by low power controller 118.

During a low power mode, when the VSS line 332 is decoupled from the VSSC line 330, the voltage of the VSS line 332 floats, removing power from alternate inverters such as 312 and 328 in the fanout network 122. Again, the leakage current can be reduced, while still ensuring that the fanout network 122 adequately propagates a valid power mode control PD signal 320 to the output of the fanout network 122, even during the low power mode. Further details of the footer gate configuration shown in FIG. 4 and its operation are given in described in U.S. Pat. No. 7,683,697 and hereby incorporated in the present specification.

In the power mode control distribution networks of FIGS. 3 and 4, half the inverters in the buffers of the distribution networks are powered down during the low power mode of operation but the other inverters of all the buffers are still supplied with continuous power through the VDDC and VSSC power supply lines and cause significant leakage current. The power mode control distribution networks 500, 600, 700, 800, 900, 1000, 1100 and 1200 illustrated in FIGS. 5 to 12 enable greater leakage current savings to be achieved.

In the examples of embodiments of the present invention illustrated in FIGS. 5 to 12, an electronic device 100 comprises a plurality of functional blocks 124, 128, and a power control module 102, 104, 118, 305 for causing selected functional blocks 124 to run in a low power mode of operation with power supply reduced or cut-off and subsequently to be restored to a full power mode of operation, while leaving other functional blocks 128 supplied continuously with power. The device 100 also includes a power mode control distribution network 122, 500, 600, 700, 800, 900, 1000, 1100 and 1200 including a plurality of serially connected chains of buffers 134 to 147, 504, 604, 704, 804, 904, 1004, 1104, 1204 and 508, 608, 708, 808, 908, 1008, 1108, 1208 for distributing power mode control signals PDN 120, PD 320 received at a common input end 502, 602, 702, 802, 902, 1002, 1102, 1202 to respective output ends 510, 610, 710, 810, 910, 1010, 1110, 1210 which are connected to respective functional blocks 124. In the low power mode of operation the power control module 102, 104, 118, 305 causes power to be supplied continuously to at least output buffers 508, 608, 708, 808, 908, 1008, 1108, 1208 at the output ends 510, 610, 710, 810, 910, 1010, 1110, 1210 of the chains while causing power supplied to other buffers 134, 135, 334, 335, 504, 604, 704, 804, 904, 1004, 1104, 1204 closer to the input end 502, 602, 702, 802, 902, 1002, 1102, 1202 of the chains to be reduced or cut-off. The output buffers 508, 608, 708, 808, 908, 1008, 1108, 1208 include feedback paths 514, 614, 714, 814, 914, 1014, 1114, 1214 for causing the states of the output buffers prior to the low power mode of operation to latch during the low power mode of operation. The chains of buffers 134 to 147, 504, 604, 704, 804, 904, 1004, 1104, 1204 and 508, 608, 708, 808, 908, 1008, 1108, 1208 may be connected in a multiple branching distribution tree 122.

Unlike the power mode control distribution networks of FIGS. 3 and 4, in the power mode control distribution networks 500, 600, 700, 800, 900, 1000, 1100 and 1200 illustrated in FIGS. 5 to 12 it is unnecessary for all the buffers to be supplied with full continuous power during the low power mode of operation. On the contrary, as stated above, the power supplied to some or all of the other buffers 134, 135, 334, 335, 504, 604, 704, 804, 904, 1004, 1104, 1204 closer to the input end 502, 602, 702, 802, 902, 1002, 1102, 1202 of the chains may be reduced or cut-off during the low power mode of operation.

The buffers 134 to 147, 504, 604, 704, 804, 904, 1004, 1104, 1204 and 508, 608, 708, 808, 908, 1008, 1108, 1208 may include respective active high inverters L-H for providing an active high signal H at an inverter output and respective active low inverters H-L for providing an active low signal L at an inverter output, the inverters of each buffer being connected in series. In the low power mode of operation the power control module 102, 104, 118, 305 may cause power to be supplied continuously to continuously powered inverters 534, 632, 734, 832, 934, 1032, 1134, 1232 of the output buffers 508, 608, 708, 808, 908, 1008, 1108, 1208 while causing power supplied to other inverters 522, 634, 732, 834, 922, 1034, 1132, 1234 of the output buffers 508, 608, 708, 808, 908, 1008, 1108, 1208 to be reduced or cut-off. The continuously powered inverters 534, 632, 734, 832, 934, 1032, 1134, 1232 of the output buffers have respective inputs and outputs, and the feedback paths 514, 614, 714, 814, 914, 1014, 1114, 1214 may apply feedback signals to the inputs of the continuously powered inverters 534, 632, 734, 832, 934, 1032, 1134, 1232 of the output buffers 508, 608, 708, 808, 908, 1008, 1108, 1208 in response to output signals at the corresponding outputs of the continuously powered inverters 534, 632, 734, 832, 934, 1032, 1134, 1232 of the same output buffers to latch the states of the output buffers during the low power mode of operation.

The power control module 102, 104, 118, 305 may include a first power supply line 130, 330 and 519, 619, 719, 819, 919, 1019, 1119, 1219 and a second power supply line 520, 620, 720, 820, 920, 1020, 1120, 1220 for connecting the selected functional blocks 124 and the other buffers 134, 135, 334, 335, 504, 604, 704, 804, 904, 1004, 1104, 1204 to a power supply 102 and the power control module 102, 104, 118, 305 interrupts connection of the selected functional blocks 124 and of the other buffers 134, 135, 334, 335, 504, 604, 704, 804, 904, 1004, 1104, 1204 through the first power supply line 130, 330 in the low power mode of operation. The power mode control distribution networks 500, 600, 700, 800 are illustrated in header configuration, with the first power supply lines 519, 619, 719, 819 as supply of voltage $V_{SSC}$ and the second power supply lines 130, 330 and 520, 620, 720, 820 as ground. The continuously powered inverters 534, 632, 734 and 832 of the output buffers are active high inverters, the feedback signals are active low, and the other inverters 522, 634, 732, 834 are active low. The power mode control distribution networks 900, 1000, 1100 and 1200 are illustrated in footer configuration, with the first power supply lines 519, 619, 719, 819 as ground, and the second power supply lines 919, 1019, 1119, 1219 as supply of voltage $V_{SSC}$. The continuously powered inverters 934, 1032, 1134, 1232 of the output buffers are active low inverters, the feedback signals are active high, and the other inverters 922, 1034, 1132, 1234 of the output buffers are active low. It will be appreciated that the first and second power supply lines are not necessarily at a positive voltage and ground but may be at any suitable voltage provided that the polarity and value of the voltage difference between them are appropriate.

The feedback paths 514, 614, 914, 1014 may include respective feedback transistors 516, 616, 916, 1016 having current conduction paths connected between the inputs 518, 618, 918, 1018 of respective continuously powered inverters 534, 632, 934, 1032 of the output buffers 508, 608, 908, 1008 and the second power supply line 520, 620, 920, 1020 and control electrodes connected with the corresponding outputs 510, 610, 910, 1010 of the continuously powered inverters 534, 632, 934, 1032 of the same output buffers. The buffers 508, 604, 908, 1004 may include preceding inverters 522, 622, 922, 1022 having drive transistors for distributing the power mode control signals to the inputs 518, 618, 918, 1018 connected with the feedback transistors 516, 616, 916, 1016, the drive transistors having channel width-to-length ratios greater than channel width-to-length ratios of the feedback transistors 516, 616, 916, 1016.

The output buffers 708, 808, 1108, 1208 have respective inputs 718, 818, 1118, 1218 and outputs 710, 810, 1110, 1210, and the feedback paths 714, 814, 1114, 1214 may apply signals to the inputs 718, 818, 1118, 1218 of the output buffers 708, 808, 1108, 1208 in response to signals at the corresponding outputs 710, 810, 1110, 1210 of the same output buffers. The feedback paths 714, 814, 1114, 1214 may include respective feedback transistors 716, 816, 1116, 1216 having current conduction paths connected between the outputs 710, 810, 1110, 1210 and the inputs 718, 818, 1118, 1218 of the same output buffers, and control electrodes connected with a continuous power supply line 720, 819, 1120, 1219 of suitable polarity. The buffers 704, 804, 1104, 1204 may include preceding inverters 722, 822, 1122, 1222 having drive transistors for distributing the power mode control signals to the inputs 718, 818, 1118, 1218 connected with the feedback transistors 716, 816, 1116, 1216, the drive transistors having channel width-to-length ratios greater than channel width-to-length ratios of the feedback transistors 716, 816, 1116, 1216.

In another example of an embodiment of the present invention, an electronic device 100 comprises a plurality of functional blocks 124, 128, and a power control module 102, 104, 118, 305 for causing selected functional blocks 124 to run in a low power mode of operation with power supply reduced or cut-off and subsequently to be restored to a full power mode of operation, while leaving other functional blocks supplied continuously with power. The device 100 also includes a power mode control distribution network 122, 500, 600, 700, 800, 900, 1000, 1100 and 1200 including a plurality of serially connected chains of inverters 522 to 534, 622 to 634, 722 to 734, 822 to 834, 922 to 934, 1022 to 1034, 1122 to 1134, 1222 to 1234 for distributing power mode control signals PDN 120, PD 320 received at a common input end 502, 602, 702, 802, 902, 1002, 1102, 1202 to respective output ends 510, 610, 710, 810, 910, 1010, 1110, 1210 which are connected to respective functional blocks 124. In the low power mode of operation the power control module 102, 104, 118, 305 causes power to be supplied continuously to at least one continuously powered output portion inverter 534, 632, 734, 832, 934, 1032, 1134, 1232 of respective output portions 508, 608, 708, 808, 908, 1008, 1108, 1208 at the output ends 510, 610, 710, 810, 910, 1010, 1110, 1210 of the chains while causing power supplied to other inverters 522 to 532, 622 to 630, 722 to 732, 822 to 830, 922 to 932, 1022 to 1030, 1122 to 1132, 1222 to 1230 closer to the input end 502, 602, 702, 802, 902, 1002, 1102, 1202 of the chains to be reduced or cut-off. The output portions 508, 608, 708, 808, 908, 1008, 1108, 1208 include feedback paths 514, 614, 714, 814, 914, 1014, 1114, 1214 for causing the states of the output portion inverters 534, 632, 734, 832, 934, 1032, 1134, 1232 prior to the low power mode of operation to latch during the low power mode of operation. The chains of inverters 522 to 534, 622 to 634, 722 to 734, 822 to 834, 922 to 934, 1022 to 1034, 1122 to 1134, 1222 to 1234 may be connected in a multiple branching distribution tree 122.

The output portions 508, 608, 708, 808, 908, 1008, 1108, 1208 may include output portion inverters 534, 632, 734, 832, 934, 1032, 1134, 1232 which are active high for providing an active high signal H at an inverter output and output portion inverters 522, 634, 732, 834, 922, 1034, 1132, 1234 which are active low for providing an active low signal L at an inverter output, the inverters of each output portion 508, 608, 708, 808, 908, 1008, 1108, 1208 being connected in series. In the low power mode of operation the power control module 102, 104, 118, 305 may cause power to be supplied continuously to the continuously powered output portion inverters 534, 632, 734, 832, 934, 1032, 1134, 1232 while causing power supplied to other output portion inverters 522, 634, 732, 834, 922, 1034, 1132, 1234 to be reduced or cut-off. The continuously powered output portion inverters 534, 632, 734, 832, 934, 1032, 1134, 1232 have respective inputs and outputs, and the feedback paths 514, 614, 714, 814, 914, 1014, 1114, 1214 may apply feedback signals to the inputs of the continuously powered output portion inverters 534, 632, 734, 832, 934, 1032, 1134, 1232 in response to output signals at the corresponding outputs of the continuously powered output portion inverters 534, 632, 734, 832, 934, 1032, 1134, 1232 of the same output portions to latch the states of the output portion inverters during the low power mode of operation.

The power control module 102, 104, 118, 305 may include a first power supply line 130, 330 and 519, 619, 719, 819, 919, 1019, 1119, 1219 and a second power supply line 520, 620, 720, 820, 920, 1020, 1120, 1220 for connecting the selected functional blocks 124 and the other inverters 522 to 532, 622 to 630, 722 to 732, 822 to 830, 922 to 932, 1022 to 1030, 1122 to 1132, 1222 to 1230 to a power supply 102 and the power control module 102, 104, 118, 305 interrupts connection of the selected functional blocks 124 and of the other inverters 522 to 532, 622 to 630, 722 to 732, 822 to 830 to 830, 922 to 932, 1022 to 1030, 1122 to 1132, 1222 to 1230 through the first power supply line 130 in the low power mode of operation.

The feedback paths 514, 614, 914, 1014 may include respective feedback transistors 516, 616, 916, 1016 having current conduction paths connected between the inputs 518, 618, 918, 1018 of respective continuously powered output portion inverters 534, 632, 934, 1032 and the second power supply line 520, 620, 920, 1020, and control electrodes connected with the corresponding outputs 510, 610, 910, 1010 of the continuously powered output portion inverters 534, 632, 934, 1032 of the same output portions. The other inverters 522, 622, 922, 1022 may include drive transistors for distributing the power mode control signals to the inputs 518, 618, 918, 1018 connected with the feedback transistors 516, 616, 916, 1016, the drive transistors having channel width-to-length ratios greater than channel width-to-length ratios of the feedback transistors 516, 616, 916, 1016.

The output portions 708, 808, 1108, 1208 have respective inputs 718, 818, 1118, 1218 and outputs 710, 810, 1110, 1210, and the feedback paths 714, 814, 1114, 1214 may apply signals to the inputs 718, 818, 1118, 1218 of the output portions 708, 808, 1108, 1208 in response to signals at the corresponding outputs 710, 810, 1110, 1210 of the same output portions. The feedback paths 714, 814, 1114, 1214 may include respective feedback transistors 716, 816, 1116, 1216 having current conduction paths connected between the outputs 710, 810, 1110, 1210 and the inputs 718, 818, 1118, 1218 of the same output portions 708, 808, 1108, 1208, and control electrodes connected with a continuous power supply line 720, 819, 1120, 1219 of suitable polarity. The other inverters may include drive transistors for distributing the power mode control signals to the inputs 718, 818 connected with the feedback transistors 716, 816, the drive transistors having channel width-to-length ratios greater than channel width-to-length ratios of the feedback transistors 716, 816.

Figure 5:
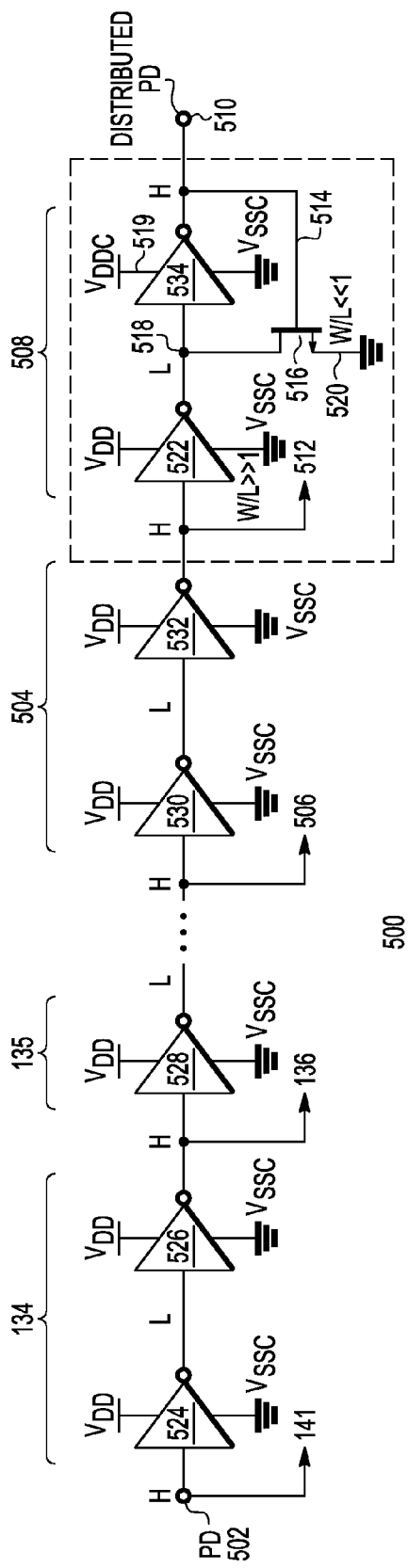
FIG. 5 is a schematic circuit diagram of part of a power mode control distribution network in accordance with one embodiment of the invention in an electronic device of the kind shown in FIG. 1, given by way of example.

In more detail, in the power mode control distribution network 122 and 500 illustrated in FIG. 5 together with FIG. 1, the serially connected chains of buffers 134 to 147 and 504 to 512 are connected in series between the input end 502, which receives an active high power mode control signal PD 320, and the output ends 510 where the buffered signals are distributed to the selected functional blocks 124. The fanout tree branches at the output of each buffer except the output buffers 508. Only the second inverters 534 of the output buffers 508 are supplied with power continuously in the low power mode of operation, through the VDDC power supply line 130, 519 and the VSSC (ground) power supply line 520. All the preceding inverters 522 to 532 are supplied with power through the VDD power supply line 132, which is powered down during the low power mode of operation, and through the VSSC (ground) power supply line 520, so that their leakage current is reduced substantially to zero. The continuously powered inverters 534 of the output buffers 508 are latched by the negative feedback paths 514 between their outputs 510 and their inputs 518 during the low power mode of operation so that the signal distributed through the chains of buffers 134 to 147 and 504 to 512 before entering the low power mode of operation is maintained. The transistors 516 whose current paths are connected between the inputs 518 of the continuously powered inverters 534 and the VSSC (ground) power supply line 520 invert the active high output signal of the inverters 534 at their gates and apply active low latch voltages to the inputs 518 of the continuously powered inverters 534. The channel width-to-length ratio W/L of the preceding inverters 522, in the output buffers 508, is much greater than the ratio W/L of the latch transistors 516 and the outputs of the preceding inverters 522 override the latch signals and restore the distribution of the power mode control signals PDN 120 once the power supply is restored to all the buffers in the chains by powering up the VDD power supply line 132.

Figure 6:
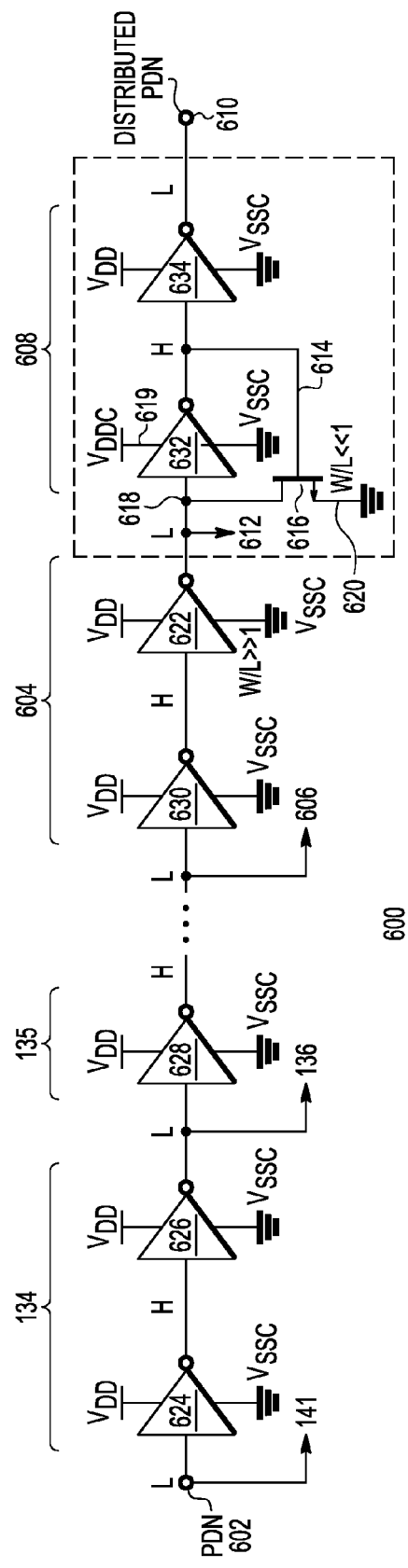
FIG. 6 is a schematic circuit diagram of part of a power mode control distribution network in accordance with another embodiment of the invention in an electronic device of the kind shown in FIG. 1, given by way of example.
Figure 9:
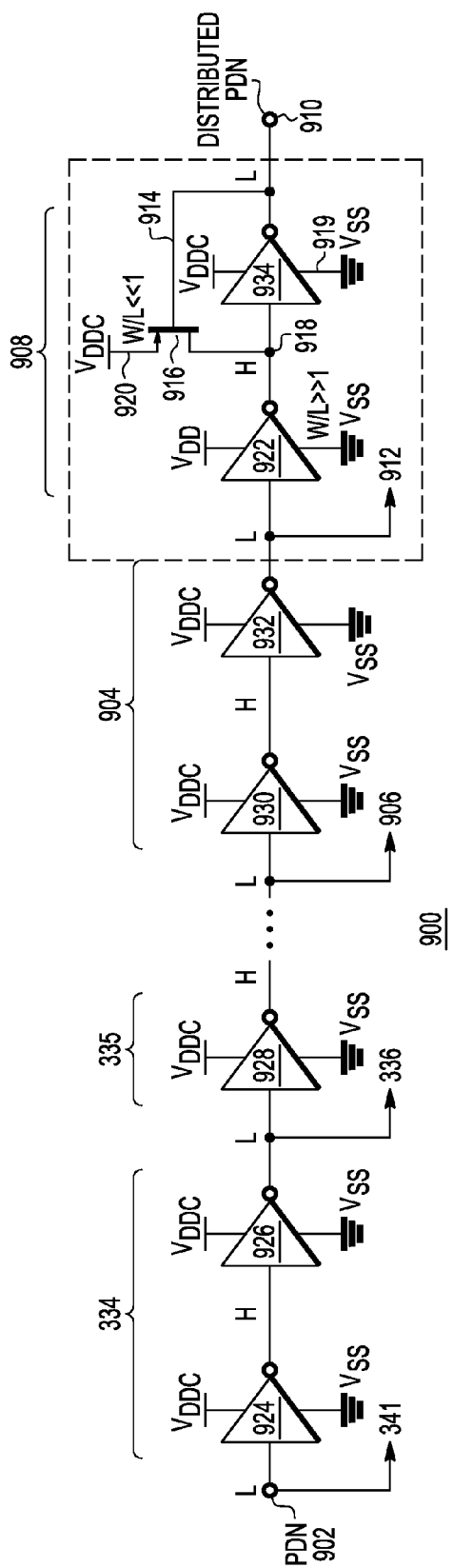
FIG. 9 is a schematic circuit diagram of part of a power mode control distribution network in accordance with one embodiment of the invention in an electronic device of the kind shown in FIG. 1, given by way of example.

In the power mode control distribution network 122 and 600 illustrated in FIG. 6 together with FIG. 1, the serially connected chains of buffers 134 to 147 and 604 to 612 are connected in series between the input end 602, which receives an active low power mode control signal PDN 120, and the output ends 610 where the buffered signals are distributed to the selected functional blocks 124. The fanout tree branches at the output of each buffer except the output buffers 608. Only the first inverters 632 of the output buffers 608 are supplied with power continuously in the low power mode of operation, through the VDDC power supply line 130 and the VSSC (ground) power supply line 620. All the preceding inverters 622 to 630 and even the second inverters 634 in the output buffers 608 are supplied with power through the VDD power supply line 132, which is powered down during the low power mode of operation, and through the VSSC (ground) power supply line 620, so that their leakage current is reduced substantially to zero. The continuously powered inverters 632 of the output buffers 608 are latched by the negative feedback paths 614 between their outputs and their inputs 618 during the low power mode of operation so that the signal distributed through the chains of buffers 134 to 147 and 604 to 612 before entering the low power mode of operation is maintained. The transistors 616 whose current paths are connected between the inputs 618 of the continuously powered inverters 632 and the VSSC (ground) power supply line 620 invert the active high output signal of the inverters 632 at their gates and apply active low latch voltages to the inputs 618 of the continuously powered inverters 632. The channel width to length ratio W/L of the preceding inverters 622, in the buffers 604, 606 preceding the output buffers 608, is much greater than the ratio W/L of the latch transistors 616 and the outputs of the preceding inverters 622 override the latch signals and restore the distribution of the power mode control signals PDN 120 once the power supply is restored to all the buffers in the chains by powering up the VDD power supply line 132. Since the first, continuously powered inverters 632 of the output buffers 608 are active high, the second inverters 634 of the output buffers 608 can maintain the outputs 610 at an active low level during the low power mode of operation through the VSSC power supply line 520, even though they are powered down, provided their configuration and channel type is appropriately chosen.

In the power mode control distribution network 122 and 700 illustrated in FIG. 7 together with FIG. 1, the serially connected chains of buffers 134 to 147 and 704 to 712 are connected in series between the input end 702, which receives an active high power mode control signal PD 320, and the output ends 710 where the buffered signals are distributed to the selected functional blocks 124. The fanout tree branches at the output of each buffer except the output buffers 708. Only the second inverters 734 of the output buffers 708 are supplied with power continuously in the low power mode of operation, through the VDDC power supply line 130 and the VSSC (ground) power supply line 720. All the preceding inverters 722 to 732 are supplied with power through the VDD power supply line 132, which is powered down during the low power mode of operation, and through the VSSC (ground) power supply line 720, so that their leakage current is reduced substantially to zero. The continuously powered inverters 734 of the output buffers 708 are latched by positive feedback paths 714 between their outputs 710 and the inputs 718 of the preceding inverters 732 in the output buffers 708 during the low power mode of operation so that the signals distributed through the chains of buffers 134 to 147 and 704 to 712 before entering the low power mode of operation are maintained. The transistors 716 whose current paths are connected between the outputs 710 of the continuously powered inverters 734 and the inputs 718 of the preceding inverters 732 transmit the active high output signal of the inverters 734 without inversion, since their gates are connected to the VSSC (ground) power supply line 720. Since the second, continuously powered inverters 734 of the output buffers 708 are active high, the first inverters 732 of the output buffers 708 which receive the active high feedback signal can maintain the inputs of the second, continuously powered inverters 734 at an active low level during the low power mode of operation, even though they are powered down, provided their configuration and channel type is appropriately chosen. The channel width to length ratio W/L of the preceding inverters 722, in the buffers 704, 706 preceding the output buffers 708, is much greater than the ratio W/L of the latch transistors 716 and the outputs of the preceding inverters 722 override the latch signals and restore the distribution of the power mode control signals PDN 120 once the power supply is restored to all the buffers in the chains by powering up the VDD power supply line 132.

In the power mode control distribution network 122 and 800 illustrated in FIG. 8 together with FIG. 1, the serially connected chains of buffers 134 to 147 and 804 to 812 are connected in series between the input end 802, which receives an active low power mode control signal PDN 120, and the output ends 810 where the buffered signals are distributed to the selected functional blocks 124. The fanout tree branches at the output of each buffer except the output buffers 808. Only the first inverters 832 of the output buffers 808 are supplied with power continuously in the low power mode of operation, through the VDDC power supply line 130 and the VSSC (ground) power supply line 820. All the preceding inverters 822 to 830 and even the second inverters 834 in the output buffers 808 are supplied with power through the VDD power supply line 132, which is powered down during the low power mode of operation, and through the VSSC (ground) power supply line 820, so that their leakage current is reduced substantially to zero. The continuously powered inverters 832 of the output buffers 808 are latched by positive feedback paths 814 to their inputs from the outputs 810 of the second inverters 834 in the output buffers 808 before and during the low power mode of operation so that the signals distributed through the chains of buffers 134 to 147 and 804 to 812 before entering the low power mode of operation are maintained. The transistors 816 whose current paths are connected between the outputs 810 of the second inverters 832 and the inputs 818 of the continuously powered inverters 834 transmit the active high output signals of the inverters 834 without inversion, since their gates are connected to the VSSC (ground) power supply line 820. Since the first, continuously powered inverters 832 of the output buffers 808 are active high, the second inverters 834 of the output buffers 808 which receive the active high signal from the first inverters 832 can maintain the outputs 810 at an active low level during the low power mode of operation and can maintain the inputs 818 of the first, continuously powered inverters 832 at an active low level during the low power mode of operation through the VSSC power supply line 820, even though they are powered down, provided their configuration and channel type is appropriately chosen. The channel width to length ratio W/L of the preceding inverters 822, in the buffers 804, 806 preceding the output buffers 808, is much greater than the ratio W/L of the latch transistors 816 and the outputs of the preceding inverters 822 override the latch signals and restore the distribution of the power mode control signals PDN 120 once the power supply is restored to all the buffers in the chains by powering up the VDD power supply line 132.

The power mode control distribution networks 122 and 500 to 800 illustrated in FIGS. 5 to 8 are illustrated by way of example in header configuration. The power mode control distribution networks 122 and 900 to 1200 illustrated in FIGS. 9 to 12 are illustrated by way of example in footer configuration. In the power mode control distribution network 122 and 900 illustrated in FIG. 9 together with FIG. 1, the serially connected chains of buffers 334 to 347 and 904 to 912 are connected in series between the input end 902, which receives an active low power mode control signal PDN 120, and the output ends 910 where the buffered signals are distributed to the selected functional blocks 124. The fanout tree branches at the output of each buffer except the output buffers 908. Only the second inverters 934 of the output buffers 908 are supplied with power continuously in the low power mode of operation, through the VDDC power supply line 920 and the VSSC (ground) power supply line 330, 919. All the preceding inverters 922 to 932 are supplied with power through the VSS (ground) power supply line 332, which is switched off during the low power mode of operation, and through the VDDC power supply line 920, so that their leakage current is reduced substantially to zero. The continuously powered inverters 934 of the output buffers 908 are latched by the negative feedback paths 914 between their outputs 910 and their inputs 918 during the low power mode of operation so that the signal distributed through the chains of buffers 334 to 347 and 904 to 912 before entering the low power mode of operation is maintained. The transistors 916 whose current paths are connected between the inputs 918 of the continuously powered inverters 934 and the VDDC power supply line 920 invert the active low output signal of the inverters 934 at their gates and apply active high latch voltages to the inputs 918 of the continuously powered inverters 934. The channel width to length ratio W/L of the preceding inverters 922, in the output buffers 908, is much greater than the ratio W/L of the latch transistors 916 and the outputs of the preceding inverters 922 override the latch signals and restore the distribution of the power mode control signals PDN 120 once the power supply is restored to all the buffers in the chains by switching on the VSS (ground) power supply line 332.

Figure 10:
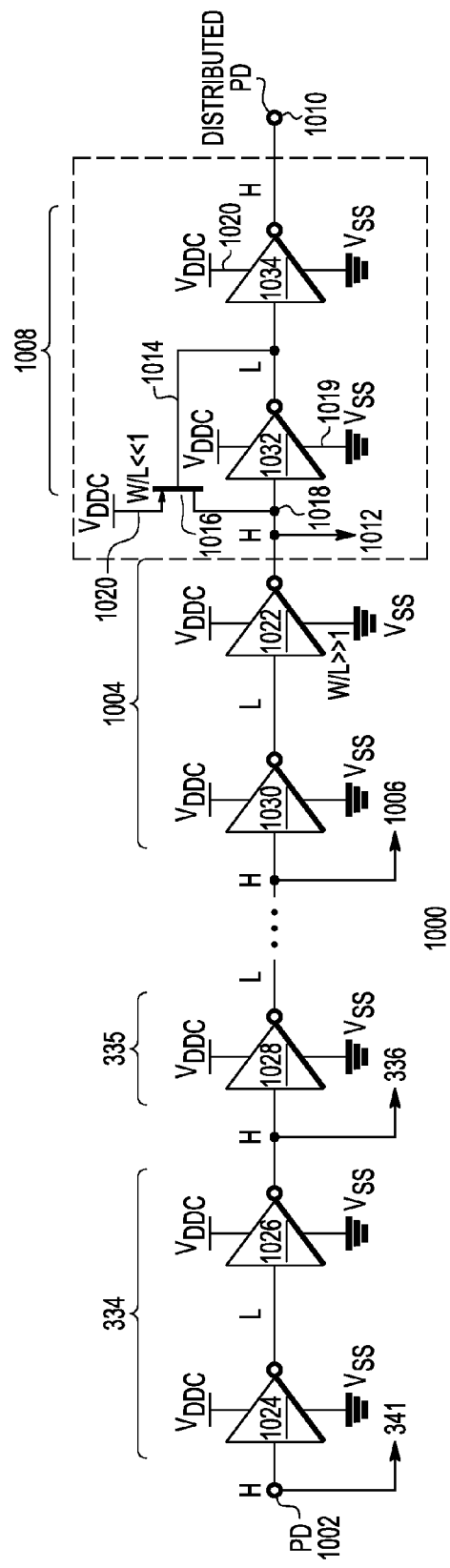
FIG. 10 is a schematic circuit diagram of part of a power mode control distribution network in accordance with another embodiment of the invention in an electronic device of the kind shown in FIG. 1, given by way of example.

In the power mode control distribution network 122 and 1000 illustrated in FIG. 10 together with FIG. 1, the serially connected chains of buffers 334 to 347 and 1004 to 1012 are connected in series between the input end 1002, which receives an active high power mode control signal PD 320, and the output ends 1010 where the buffered signals are distributed to the selected functional blocks 124. The fanout tree branches at the output of each buffer except the output buffers 1008. Only the first inverters 1032 of the output buffers 1008 are supplied with power continuously in the low power mode of operation, through the VSSC (ground) power supply line 330, 1019 and the VDDC power supply line 1020. All the preceding inverters 1022 to 1030 and even the second inverters 1034 in the output buffers 1008 are supplied with power through the VSS (ground) power supply line 332, which is switched off during the low power mode of operation, and through the VDDC power supply line 1020, so that their leakage current is reduced substantially to zero. The continuously powered inverters 1032 of the output buffers 1008 are latched by the negative feedback paths 1014 between their outputs and their inputs 1018 during the low power mode of operation so that the signal distributed through the chains of buffers 334 to 347 and 1004 to 1012 before entering the low power mode of operation is maintained. The transistors 1016 whose current paths are connected between the inputs 1018 of the continuously powered inverters 1032 and the VDDC power supply line 1020 invert the active low output signal of the inverters 1032 at their gates and apply active high latch voltages to the inputs 1018 of the continuously powered inverters 1032. The channel width to length ratio W/L of the preceding inverters 1022, in the buffers 1004, 1006 preceding the output buffers 1008, is much greater than the ratio W/L of the latch transistors 1016 and the outputs of the preceding inverters 1022 override the latch signals and restore the distribution of the power mode control signals PD 320 once the power supply is restored to all the buffers in the chains by switching on the VSS (ground) power supply line 332. Since the first, continuously powered inverters 1032 of the output buffers 1008 are active low, the second inverters 1034 of the output buffers 1008 can maintain the outputs 1010 at an active high level during the low power mode of operation through the VDDC power supply line 332, 1020, even though they are powered down, provided their configuration and channel type is appropriately chosen.

Figure 11:
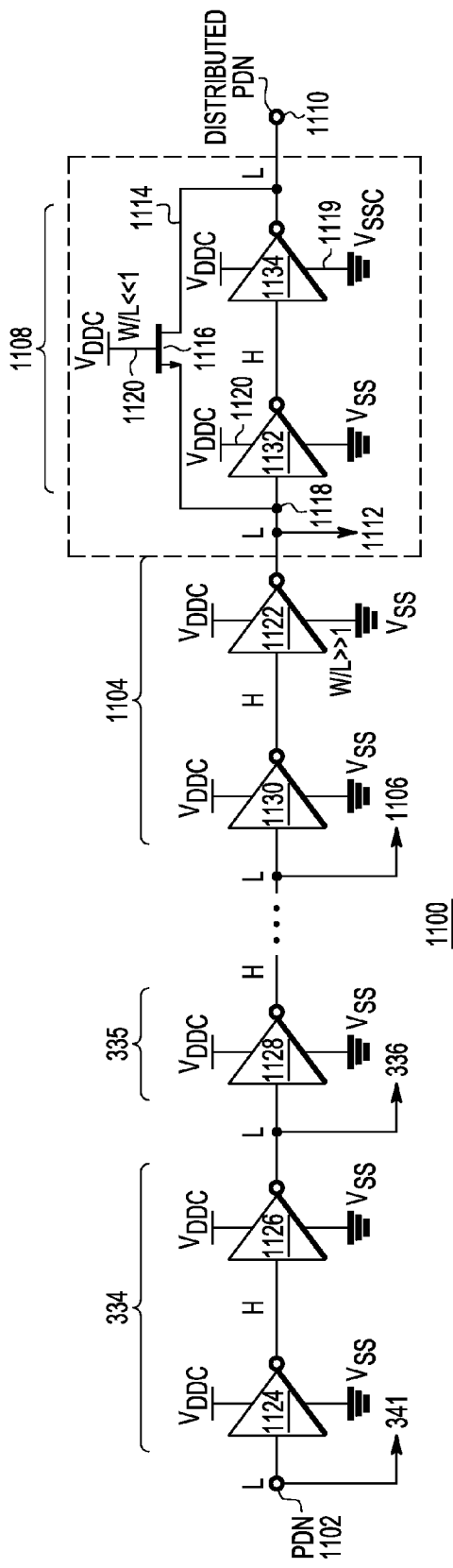
FIG. 11 is a schematic circuit diagram of part of a power mode control distribution network in accordance with another embodiment of the invention in an electronic device of the kind shown in FIG. 1, given by way of example.

In the power mode control distribution network 122 and 1100 illustrated in FIG. 11 together with FIG. 1, the serially connected chains of buffers 334 to 347 and 1104 to 1112 are connected in series between the input end 1102, which receives an active low power mode control signal PDN 120, and the output ends 1110 where the buffered signals are distributed to the selected functional blocks 124. The fanout tree branches at the output of each buffer except the output buffers 1108. Only the second inverters 1134 of the output buffers 1108 are supplied with power continuously in the low power mode of operation, through the VSSC (ground) power supply line 330, 1119 and the VDDC power supply line 1120. All the preceding inverters 1122 to 1132 are supplied with power through the VSS (ground) power supply line 332, which is switched off during the low power mode of operation, and through the VDDC power supply line 1120, so that their leakage current is reduced substantially to zero. The continuously powered inverters 1134 of the output buffers 1108 are latched by positive feedback paths 1114 between their outputs 1110 and the inputs 1118 of the preceding inverters 1132 in the output buffers 1108 during the low power mode of operation so that the signals distributed through the chains of buffers 134 to 147 and 1104 to 1112 before entering the low power mode of operation are maintained. The transistors 1116 whose current paths are connected between the outputs 1110 of the continuously powered inverters 1134 and the inputs 1118 of the preceding inverters 1132 transmit the active low output signal of the inverters 1134 without inversion, since their gates are connected to the VDDC power supply line 1120. Since the second, continuously powered inverters 1134 of the output buffers 1108 are active low, the first inverters 1132 of the output buffers 1108 which receive the active low feedback signal can maintain the inputs of the second, continuously powered inverters 1134 at an active high level during the low power mode of operation through the VDDC power supply line 1120, even though they are powered down, provided their configuration and channel type is appropriately chosen. The channel width to length ratio W/L of the preceding inverters 1122, in the buffers 1104, 1106 preceding the output buffers 1108, is much greater than the ratio W/L of the latch transistors 1116 and the outputs of the preceding inverters 1122 override the latch signals and restore the distribution of the power mode control signals PDN 120 once the power supply is restored to all the buffers in the chains by switching on the VSS power supply line 332.

Figure 12:
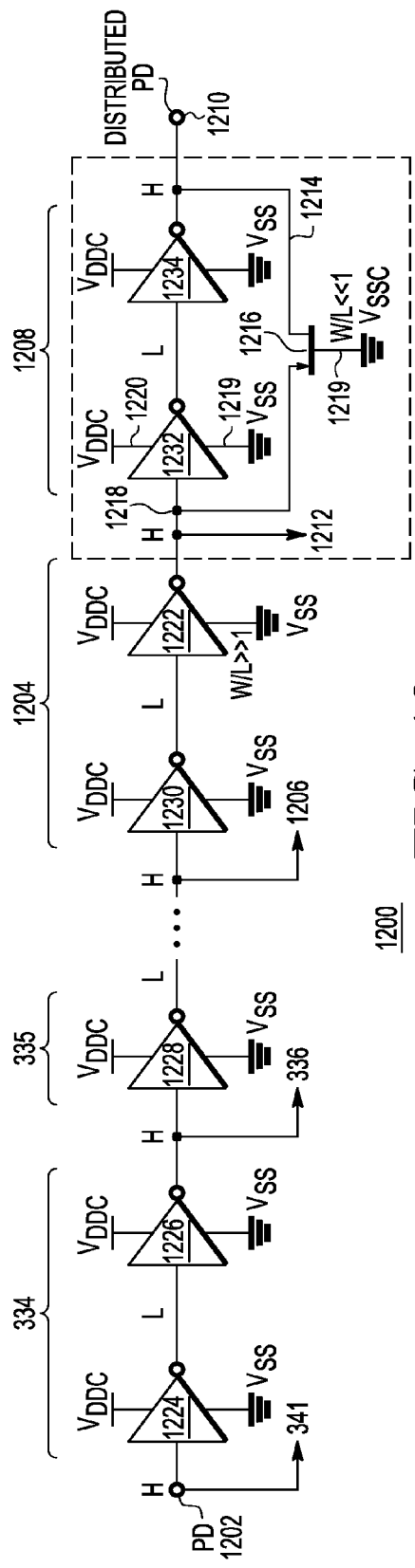
FIG. 12 is a schematic circuit diagram of part of a power mode control distribution network in accordance with yet another embodiment of the invention in an electronic device of the kind shown in FIG. 1, given by way of example.

In the power mode control distribution network 122 and 1200 illustrated in FIG. 12 together with FIG. 1, the serially connected chains of buffers 134 to 147 and 1204 to 1212 are connected in series between the input end 1202, which receives an active high power mode control signal PD 320, and the output ends 1210 where the buffered signals are distributed to the selected functional blocks 124. The fanout tree branches at the output of each buffer except the output buffers 1208. Only the first inverters 1232 of the output buffers 1208 are supplied with power continuously in the low power mode of operation, through the VSSC (ground) power supply line 330, 1219 and the VDDC power supply line 1220. All the preceding inverters 1222 to 1230 and even the second inverters 1234 in the output buffers 1208 are supplied with power through the VSS (ground) power supply line 332, which is switched off during the low power mode of operation, and through the VDDC power supply line 1220, so that their leakage current is reduced substantially to zero. The continuously powered inverters 1232 of the output buffers 1208 are latched by positive feedback paths 1214 to their inputs from the outputs 1210 of the second inverters 1234 in the output buffers 1208 before and during the low power mode of operation so that the signals distributed through the chains of buffers 134 to 147 and 1204 to 1212 before entering the low power mode of operation are maintained. The transistors 1216 whose current paths are connected between the outputs 1210 of the second inverters 1232 and the inputs 1218 of the continuously powered inverters 1234 transmit the active high output signals of the inverters 1234 without inversion, since their gates are connected to the VSSC (ground) power supply line 1220. Since the first, continuously powered inverters 1232 of the output buffers 1208 are active low, the second inverters 1234 of the output buffers 1208 which receive the active low signal from the first inverters 1232 can maintain the outputs 1210 at an active high level during the low power mode of operation and can maintain the inputs 1218 of the first, continuously powered inverters 1232 at an active high level during the low power mode of operation through the VDDC power supply line 1220, even though they are powered down, provided their configuration and channel type is appropriately chosen. The channel width to length ratio W/L of the preceding inverters 1222, in the buffers 1204, 1206 preceding the output buffers 1208, is much greater than the ratio W/L of the latch transistors 1216 and the outputs of the preceding inverters 1222 override the latch signals and restore the distribution of the power mode control signals PD 320 once the power supply is restored to all the buffers in the chains by switching on the VSS power supply line 332.

In the power mode control distribution networks 122, 500, 600, 700, 800, 900, 1000, 1100 and 1200 illustrated in FIGS. 5 to 12, together with FIG. 1, the buffers are non-inverting buffers each of which has an even number of inverters. The multiple branching distribution tree 122 branch at the outputs of successive buffers. However, the buffers may alternatively have odd numbers of inverters, provided the logic level at the output ends 510, 610, 710, 810, 910, 1010, 1110, 1210 of the chains is suitable. The power mode control signal distributed by the chains of buffers may be of opposite polarity from the input power mode control signal, and may be inverted by an inverter in the destination functional blocks, or may be used without signal inversion with opposite logic in the destination functional blocks. In one example of an embodiment each of the buffers may even comprise only a single inverter, in which case, the multiple branching distribution tree 122 may branch at the outputs of successive inverters. It will be appreciated that the possible configurations will be assessed as a function of the ability of the buffer/inverter chains to maintain the strengths of the distributed power mode control signals to the output ends of the chains.

The inverters in the power mode control distribution networks 122, 500, 600, 700, 800, 900, 1000, 1100 and 1200 may be similar to the kind illustrated in FIGS. 3 and 4, with the differences that the output buffers/portions 508, 608, 708, 808, 908, 1008, 1108, 1208 include the feedback paths 514, 614, 714, 814, 914, 1014, 1114, 1214, and that the other buffers/inverters closer to the input end 502, 602, 702, 802, 902, 1002, 1102, 1202 of the chains are not connected continuously and fully to the power supply 102 during the low power mode of operation, having their power supply reduced or cut-off, instead. The inverters in the power mode control distribution networks 122, 500, 600, 700, 800 may have stacked N-channel transistors like 202 and 222 connected with current conduction paths in series with P-channel transistors like 200 and 220 between the VDDC line 130 (case of the output buffers/portions 508, 608, 708, 808) or the VDD line 132 (case of the other buffers/portions) and ground and their gates connected to the input nodes 201 and 209 of the buffers 134 and 135, respectively, for example. The inverters in the power mode control distribution networks 122, 900, 1000, 1100 and 1200 may have stacked P-channel transistors like 302 and 322 connected with current conduction paths in series with N-channel transistors like 300 and 320 between the VDDC line 130 and the other (ground) power supply line VSSC 330 (case of the output buffers/portions 908, 1008, 1108, 1208) or the VSS line 332 (case of the other buffers/portions) and their gates connected to the input nodes of the buffers 334 and 335, respectively, for example.

In the examples of power mode control distribution networks 122, 500, 600, 700, 800, 900, 1000, 1100 and 1200 illustrated in FIGS. 5 to 12, together with FIG. 1, all but one inverter 534, 632, 734, 832, 934, 1032, 1134, 1232 in each of the serially connected chains of buffers 134 to 147, 504, 604, 704, 804, 904, 1004, 1104, 1204 and 508, 608, 708, 808, 908, 1008, 1108, 1208 are powered down during the low power mode of operation. This enables a much bigger saving of leakage current than the power mode control distribution networks of FIGS. 3 and 4. However, it will be appreciated that it is not essential to power down all of the inverters apart from 534, 632, 734, 832, 934, 1032, 1134, 1232 in each chain if a reduced saving of leakage current is sufficient. Since the inverters 534, 632, 734, 832, 934, 1032, 1134, 1232 whose states are latched by the feedback paths 514, 614, 714, 814, 914, 1014, 1114, 1214 are in buffers 508, 608, 708, 808, 908, 1008, 1108, 1208 at the output ends 510, 610, 710, 810, 910, 1010, 1110, 1210 of the chains, the states of the distributed buffered signals at the output ends 510, 510, 610, 710, 810, 910, 1010, 1110, 1210 of the chains are preserved during the low power mode of operation, however many of the preceding inverters are powered down. In the case of the distribution networks 600, 800, 1000 and 1200, inverters such as 634, 834, 1034, 1234 situated after the latched inverters 632, 832, 1032, 1232 are powered down in the buffers 608, 808, 1008, 1208 but it will be appreciated that the inverters 634, 834, 1034, 1234 can still maintain the output ends 610, 810, 1010, 1210 of the chains at the correct state, since they are active low inverters, provided the polarities and channel types are suitable.

The feedback transistors 516, 616, 716, 816, 916, 1016, 1116, 1216 have a width-to-length ratio much less than one (W/L<<1) whereas the drive transistors (not shown in FIGS. 5 to 8) in the preceding inverters 522, 622, 722, 822, 922, 1022, 1122, 1222 have a width-to-length ratio much greater than one (W/L>>1). In operation, the transistors 516, 616, 716, 816, 916, 1016, 1116, 1216 apply a sufficient feedback signal derived from the output of the continuously powered inverters 534, 632, 734, 832, 934, 1032, 1134, 1232 to a preceding input of an inverter with the appropriate phase to latch the output buffer 508, 608, 708, 808, 908, 1008, 1108, 1208. When the power is restored, the greater current of the drive transistors in the preceding inverters 522, 622, 722, 822, 922, 1022, 1122, 1222 overrides the feedback signal which was latching the output buffer due to their greater W/L.

In the examples of power mode control distribution networks 122, 500, 600, 900, 1000 the feedback transistors 516, 616, 916, 1016 are transistors having current conduction paths connected between the inputs 518, 618, 918, 1018 of respective continuously powered inverters 534, 632, 934, 1032 of the output buffers 508, 608, 908, 1008 and the second power supply line 520, 620, 920, 1020 and feed back the output signals of the inverters 534, 632, 934, 1032 to their inputs. However, it will be appreciated that in certain configurations it is possible for the feedback paths 514, 614, 914, 1014 to feed back the output signals of continuously powered output inverters 534, 632, 934, 1032 to their inputs, using transistors having current conduction paths connected between the inputs of the inverters of the continuously powered output buffers 508, 608, 908, 1008 and the first, continuously powered power supply line VDDC 130, or VSSC 330.

Similarly, in the examples of power mode control distribution networks 122, 700, 800, 1100, 1200 the feedback transistors 716, 816, 1116, 1216 are transistors having current conduction paths connected between the outputs 710, 810, 1110, 1210 and the inputs 718, 818, 1118, 1218 of the continuously powered output buffers 708, 808, 1108, 1208 with their gates connected to the second power supply line 720, 820, 1120, 1220 to feed back the output signals of the output buffers 708, 808, 1108, 1208 to their inputs. However, it will be appreciated that in certain configurations it is possible for the feedback paths 714, 814, 1114, 1214 to feed back the output signals of the output buffers 708, 808, 1108, 1208 to their inputs using transistors having current conduction paths connected between the outputs 710, 810, 1110, 1210 and the inputs 718, 818, 1118, 1218 of the continuously powered output buffers 508, 608, 1108, 1208 with their gates connected to the first, continuously powered power supply line 719, 819, 1119, 1219.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice versa. Also, a plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will appreciated that conductivity types and polarities of potentials may be reversed.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

The terms "assert" or "set" and "negate" (or "de-assert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. Similarly, any arrangement of components to achieve the same functionality is effectively "associated" such that the desired functionality is achieved. Hence, any two components combined to achieve a particular functionality can be seen as "associated with" each other such that the desired functionality is achieved, irrespective of architectures or intermediate components. Likewise, any two components so associated can also be viewed as being "operably connected," or "operably coupled," to each other to achieve the desired functionality.

Also for example, in one embodiment, the illustrated examples may be implemented as circuitry located on a single integrated circuit or within a same device. Alternatively, the examples may be implemented as any number of separate integrated circuits or separate devices interconnected with each other in a suitable manner.

Also for example, the examples, or portions thereof, may implemented as soft or code representations of physical circuitry or of logical representations convertible into physical circuitry, such as in a hardware description language of any appropriate type.

In the claims, the word 'comprising' or 'having' does not exclude the presence of other elements or steps then those listed in a claim. Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The fact that certain measures are recited in mutually different claims does not indicate that a combination of these measures cannot be used to advantage.

The invention claimed is:

1. An electronic device, comprising:
a plurality of functional blocks;
a power control module for causing selected functional blocks to operate in a low power mode with power supply reduced or cut-off and subsequently to be restored to a full power mode, while leaving other functional blocks supplied continuously with power; and
a power mode control distribution network including a plurality of serially connected chains of buffers for distributing power mode control signals received at a common input end to respective output ends that are connected to respective functional blocks;
wherein in said low power mode said power control module causes power to be supplied continuously to at least output buffers at said output ends of said chains while causing power supplied to other buffers closer to said input end of said chains to be reduced or cut-off,
wherein said output buffers include feedback paths for causing the states of said output buffers prior to said low power mode to latch during said low power mode, and
wherein said buffers of said chains include respective high active inverters for providing a high active signal at an inverter output and respective low active inverters for providing a low active signal at an inverter output, the inverters of each buffer being connected in series, wherein in said low power mode said power control module causes power to be supplied continuously to continuously powered inverters of said output buffers while causing power supplied to other inverters of said output buffers to be reduced or cut-off.

2. The electronic device of claim 1, wherein said continuously powered inverters of said output buffers have respective inputs and outputs, and said feedback paths apply feedback signals to said inputs of said continuously powered inverters of said output buffers in response to output signals at the corresponding outputs of said continuously powered inverters of the same output buffers to latch the states of the output buffers during the low power mode.

3. The electronic device of claim 2, wherein said power control module includes first and second power supply lines for connecting said selected functional blocks and of said other buffers to a power supply and said power control module interrupts connection of said selected functional blocks and of said other buffers through said first power supply line in said low power mode of operation, and wherein said feedback paths include respective feedback transistors having current conduction paths connected between said inputs of respective continuously powered inverters of said output buffers and said second power supply line, and control electrodes connected with the corresponding outputs of said continuously powered inverters of the same output buffers.

4. The electronic device of claim 3, wherein said buffers include preceding inverters having drive transistors for distributing said power mode control signals to said inputs connected with said feedback transistors, said drive transistors having channel width-to-length ratios greater than channel width-to-length ratios of said feedback transistors.

5. The electronic device of claim 1, wherein said output buffers have respective inputs and outputs, and said feedback paths apply signals to the inputs of the output buffers in response to signals at the corresponding outputs the same output buffers.

6. The electronic device of claim 5, wherein said power control module includes first and second power supply lines for connecting said selected functional blocks and said other buffers to a power supply and said power control module interrupts connection of said selected functional blocks and of said other buffers through said first power supply line in said low power mode, and wherein said feedback paths include respective feedback transistors having current conduction paths connected between said outputs and said inputs of the same output buffers, and control electrodes connected with a continuous power supply line of suitable polarity.

7. The electronic device of claim 6, wherein said buffers include preceding inverters having drive transistors for distributing said power mode control signals to said inputs connected with said feedback transistors, said drive transistors having channel width-to-length ratios greater than channel width-to-length ratios of said feedback transistors.

8. The electronic device of claim 1, wherein said chains of buffers are connected in a multiple branching distribution tree.

9. An electronic device, comprising:
a plurality of functional blocks;
a power control module for causing selected functional blocks to operate in a low power mode with power supply reduced or cut-off and subsequently to be restored to a full power mode of operation, while leaving other functional blocks supplied continuously with power; and
a power mode control distribution network including a plurality of serially connected chains of inverters for distributing power mode control signals received at a common input end to respective output ends that are connected to respective ones of the plurality of functional blocks;
wherein in said low power mode said power control module causes power to be supplied continuously to at least one continuously powered output portion inverter of respective output portions at said output ends of said chains while causing power supplied to other inverters closer to said input end of said chains to be reduced or cut-off,
wherein said output portions include feedback paths for causing the states of said output portion inverters prior to said low power mode to latch during said low power mode, and
wherein said output portions include high active output portion inverters that provide a high active signal at an inverter output, and low active output portion inverters that provide a low active signal at an inverter output, wherein the inverters of each output portion are connected in series, and wherein in said low power mode said power control module causes power to be supplied continuously to said continuously powered output portion inverters while causing power supplied to other output portion inverters to be reduced or cut-off.

10. The electronic device of claim 9, wherein said continuously powered output portion inverters have respective inputs and outputs, and said feedback paths apply feedback signals to said inputs of said continuously powered output portion inverters in response to output signals at the corresponding outputs of said continuously powered output portion inverters of the same output portions to latch the states of the output portion inverters during the low power mode.

11. The electronic device of claim 10, wherein:
said power control module includes first and second power supply lines for connecting said selected functional blocks and said other inverters to a power supply; and
said power control module interrupts connection of said selected functional blocks and of said other inverters through said first power supply line in said low power mode of operation, and
wherein said feedback paths include respective feedback transistors having current conduction paths connected between said inputs of respective continuously powered output portion inverters and said second power supply line, and control electrodes connected with the corresponding outputs of said continuously powered output portion inverters of the same output portions.

12. The electronic device of claim 11, wherein said other inverters include drive transistors for distributing the power mode control signals to said inputs connected with said feedback transistors, said drive transistors having channel width-to-length ratios greater than channel widths of said feedback transistor-to-length ratios.

13. The electronic device of claim 9, wherein said output portions have respective inputs and outputs, and said feedback paths apply signals to said inputs of said output portions in response to signals at the corresponding outputs of the same output portions.

14. The electronic device of claim 13, wherein said power control module includes,
first and second power supply lines for connecting said selected functional blocks and of said other inverters to a power supply and said power control module interrupts connection of said selected functional blocks and of said other inverters through said first power supply line in said low power mode, and
wherein said feedback paths include respective feedback transistors having current conduction paths connected between said outputs and said inputs of the same output portions, and control electrodes connected with a continuous power supply line of suitable polarity.

15. The electronic device of claim 14, wherein said other inverters include drive transistors for distributing the power mode control signals to said inputs connected with said feedback transistors, said drive transistors having channel width-to-length ratios greater than channel width-to-length ratios of said feedback transistors.

16. The electronic device of claim 9, wherein said chains of inverters are connected in a multiple branching distribution tree.

* * * * *